United States Patent
Davis et al.

(10) Patent No.: US 9,711,267 B2
(45) Date of Patent: Jul. 18, 2017

(54) SUPPORT STRUCTURE FOR CYLINDRICAL SUPERCONDUCTING COIL STRUCTURE

(71) Applicant: SIEMENS HEALTHCARE LIMITED, Camberley (GB)

(72) Inventors: Peter Jonathan Davis, Oxford (GB); Yunxin Gao, Grove (GB); Martin Howard Hempstead, Ducklington (GB); Matthew John Longfield, Witney (GB)

(73) Assignee: Siemens Healthcare Limited, Camberley (GB)

( * ) Notice: Subject to any disclaimer, the term of this patent is extended or adjusted under 35 U.S.C. 154(b) by 0 days.

(21) Appl. No.: 15/103,674

(22) PCT Filed: May 12, 2014

(86) PCT No.: PCT/EP2014/059598
§ 371 (c)(1),
(2) Date: Jun. 10, 2016

(87) PCT Pub. No.: WO2015/090628
PCT Pub. Date: Jun. 25, 2015

(65) Prior Publication Data
US 2016/0314885 A1 Oct. 27, 2016

(30) Foreign Application Priority Data
Dec. 20, 2013 (GB) .................................. 1322808.5

(51) Int. Cl.
*H01F 6/06* (2006.01)
*G01R 33/38* (2006.01)
*G01R 33/3815* (2006.01)

(52) U.S. Cl.
CPC ........... *H01F 6/06* (2013.01); *G01R 33/3802* (2013.01); *G01R 33/3815* (2013.01)

(58) Field of Classification Search
CPC ......... H01F 6/06; H01F 6/00; G01R 33/3802; G01R 33/3815
See application file for complete search history.

(56) References Cited

U.S. PATENT DOCUMENTS

| 4,896,128 A | 1/1990 | Wollan et al. |
| 5,574,417 A * | 11/1996 | Dorri ................. G01R 33/3806 324/319 |
| 6,166,617 A | 12/2000 | Laskaris et al. |
| 7,242,191 B2 * | 7/2007 | Laskaris ............ G01R 33/3806 324/318 |
| 2011/0193665 A1 | 8/2011 | Huang et al. |

FOREIGN PATENT DOCUMENTS

| GB | 2484079 A | 4/2012 |
| GB | 2487813 A | 8/2012 |
| GB | 2489126 A | 9/2012 |
| JP | H02134802 A | 5/1990 |

* cited by examiner

*Primary Examiner* — Bernard Rojas
(74) *Attorney, Agent, or Firm* — Schiff Hardin LLP

(57) ABSTRACT

An arrangement for supporting a cylindrical superconducting coil structure has recesses in an axial end-surface of the coil structure, and support brackets that individually horizontally protrude into the recesses, such that a vertical loading on the support brackets bears the weight of the coil structure. Opposite ends of the support brackets engage a support member, which supports the support brackets engaged therein, thereby also bearing the weight of the coil structure.

25 Claims, 9 Drawing Sheets

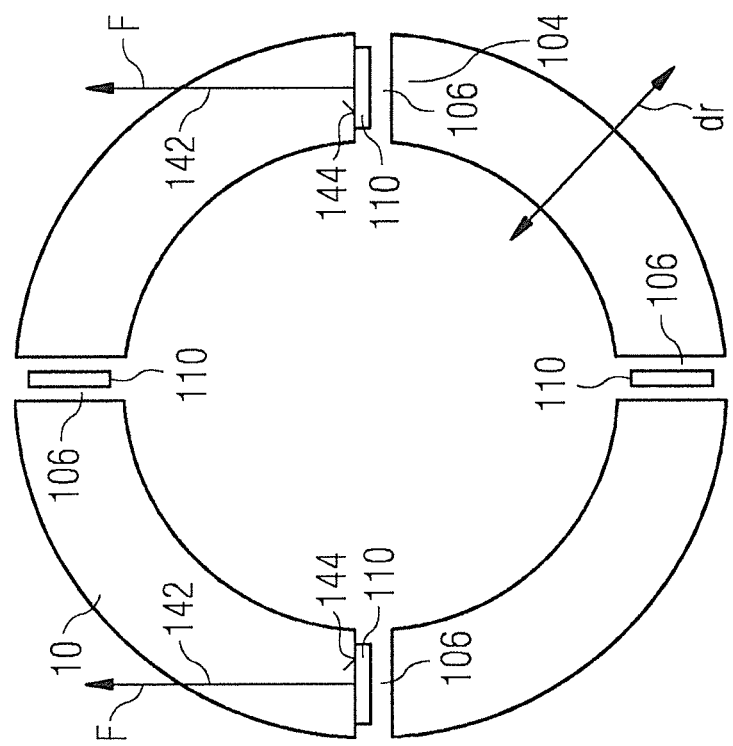
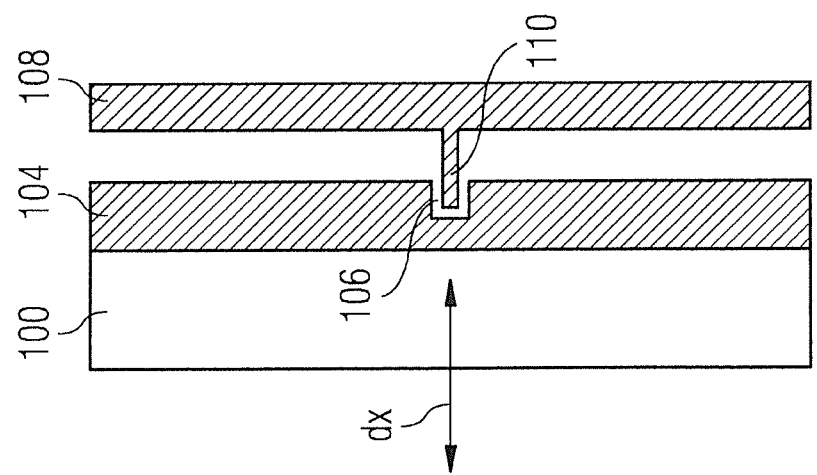

SUPPORT STRUCTURE FOR CYLINDRICAL SUPERCONDUCTING COIL STRUCTURE

BACKGROUND OF THE INVENTION

Field of the Invention

The present invention concerns support structures for supporting cylindrical superconducting magnets, for example as used in Magnetic Resonance Imaging (MRI) systems. Such magnets must be cooled to below the transition temperature of the superconducting wire used, for example to a temperature of approximately 4K, which may be achieved by use of liquid helium, which requires the superconducting electromagnet to be placed in a cryostat to isolate it from ambient temperature.

Description of the Prior Art

FIG. 1 shows an example conventional arrangement of a cryostat including a cryogen vessel 12. A cooled superconducting magnet comprises a coil structure 10 within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator 17 may be located within access turret 19, which retains access neck (vent tube) 20 mounted at the top of the cryostat. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K. Other arrangements are known. Notably, certain arrangements do not require the provision of a cryogen vessel 12 around the coil structure 10.

The present invention provides a support structure to support the coils of a superconducting magnet 10 such as discussed above, which allows concentricity of the coils to the support structure to be maintained at all temperatures, while allowing relative movement of the coils with respect to the support structure in radial and axial directions due to thermal mismatch between the coils and the support structure, and radial and axial expansion or contraction of the coils due to magnetic loading.

The prior art contains several examples of support structures which have addressed similar problems. In one such arrangement, coils are wound into cavities defined on a radially outer surface of a cylindrical former, for example of aluminium. The coils are then impregnated with a thermosetting resin. When cooled to operating temperature, the former tends to contract to a greater extent than the coils. This results in the coils hanging loose on the former—essentially touching the former only at one circumferential point—or the coils may be held onto the former with coil clamps, which contact outer radial surfaces of the coils at circumferential intervals, and may result in the radially inner surface of the coils not touching the former at all. With such solutions, it is difficult to predict to a high accuracy the location of the coil centre, when cold. Point loading or stress concentrations from the support structure to the coils occur in this conventional structure.

U.S. Pat. No. 4,896,128 and GB2489126 describe superconducting coil assemblies.

SUMMARY OF THE INVENTION

The present invention provides an arrangement for supporting a superconducting electromagnet coil structure, wherein the aforementioned point loading and stress concentrations are avoided.

The present invention particularly addresses superconducting coil assemblies of a so-called "serially bonded" construction. In such arrangements, annular coils are joined by spacers to keep then at a desired axial spacing and axial alignment. The coils and the spacers are bonded together to form a self-supporting structure. No former is used. Examples of such arrangements are described in WO2011/148163. The present invention may also be applied to other coil structures.

In certain embodiments, the invention provides support rings bonded to axial extremities of the coil structure. Radial slots are cut into the support ring, and brackets arranged to support the weight of the coil structure protrude into the radial slots, such that the vertical loading of the support ring bears the weight of the coil structure. A shear loading between coil and ring is minimised, since a large bonded area is provided between ring and coil.

In certain embodiments, the invention provides support rings bonded to axial extremities of the coil structure. Radial slots are cut into the support ring, and brackets arranged to support the weight of the coil structure protrude into the radial slots, such that the vertical loading of the support ring bears the weight of the coil structure. A shear loading between coil and ring is minimized, since a large bonded area is provided between ring and coil.

BRIEF DESCRIPTION OF THE DRAWINGS

FIG. 7 schematically illustrates a range of axial movement dx allowed according to an embodiment of the present invention.

FIG. 8 schematically illustrates a range of radial movement dr allowed according to an embodiment of the present invention.

DESCRIPTION OF THE PREFERRED EMBODIMENTS

The present invention relates particularly, but not exclusively, to serially-bonded coil structures. The present invention may also be applied to other coil structures. For example, even coil structures wound onto a former of aluminium, or composite etc. may benefit from the present invention by having the former supported by the apparatus described herein.

Figure 1:
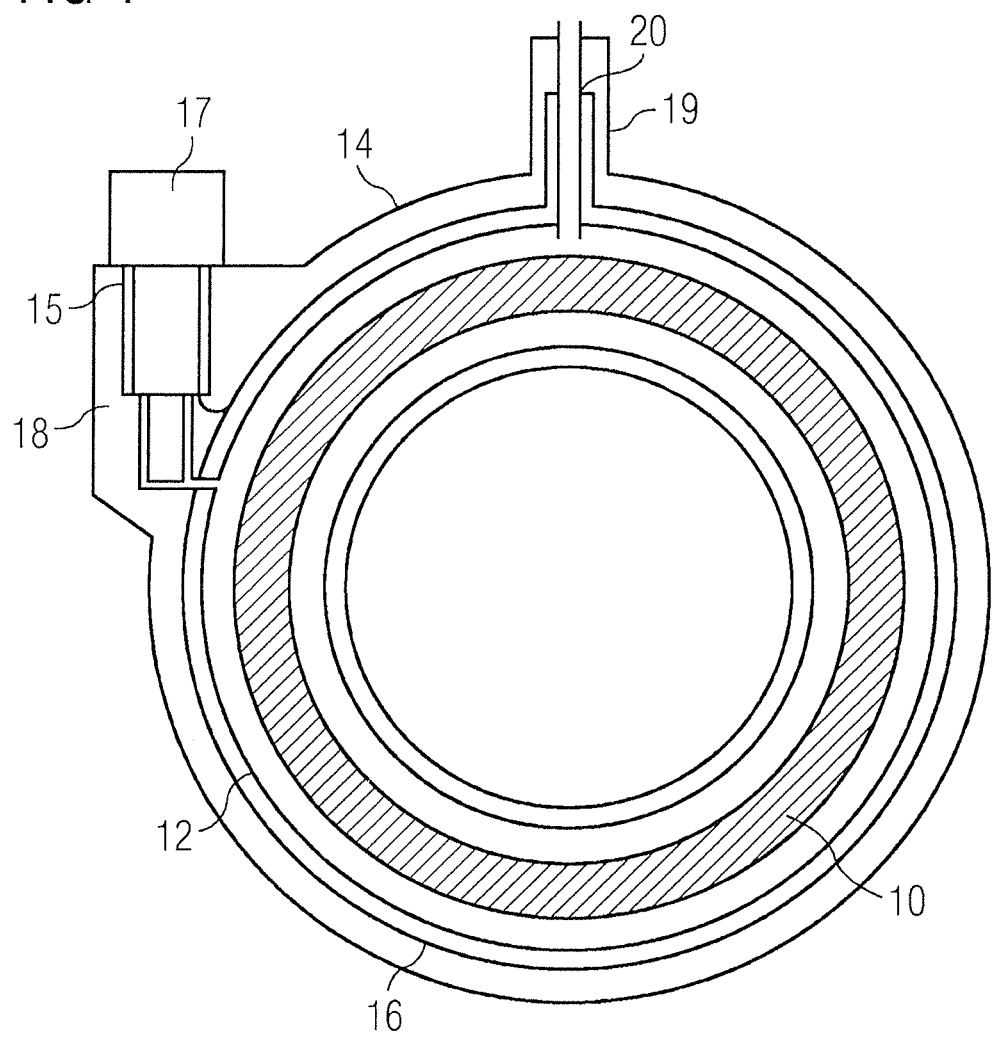
FIG. 1 shows a conventional arrangement of a superconducting magnet within a cryostat.
Figure 2:
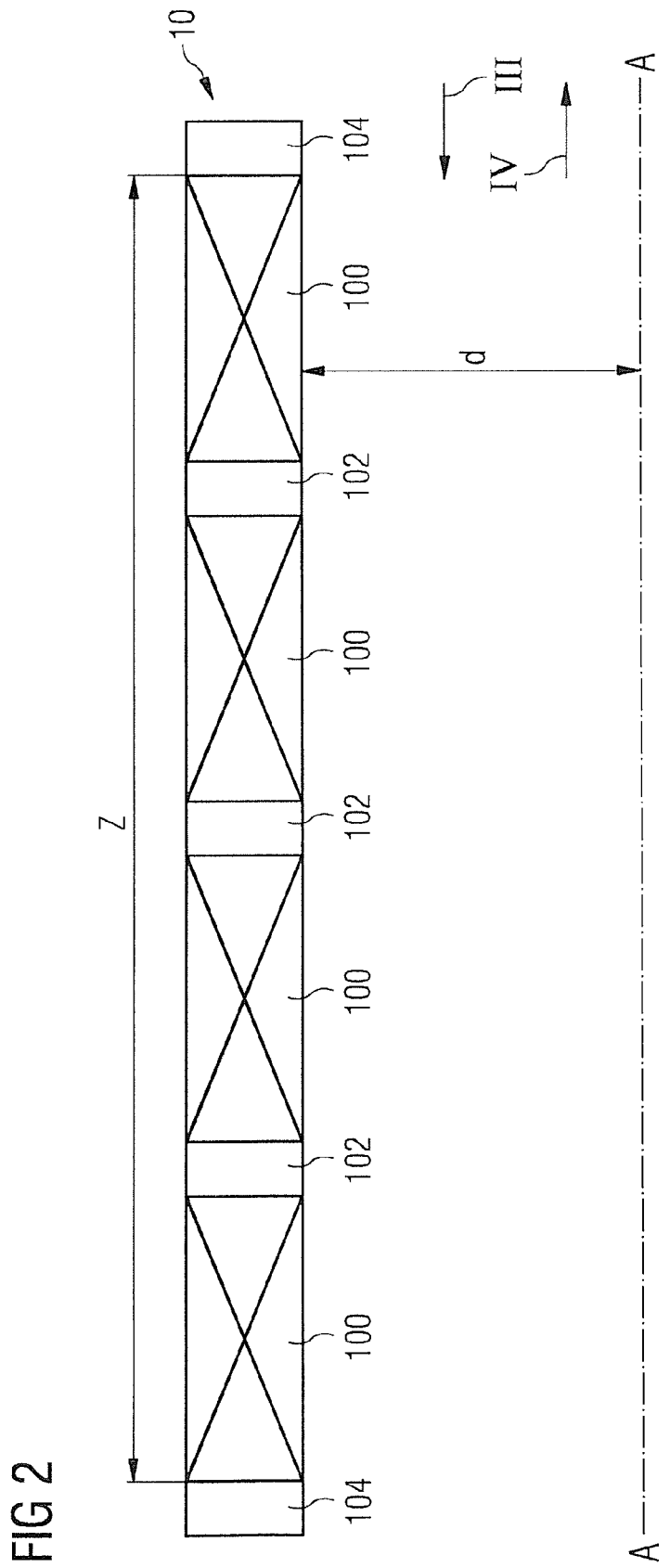
FIG. 2 shows a half-cross-section of a serially bonded coil structure, to which the present invention may be applied.

An example of a serially-bonded coil structure 10 is shown in FIG. 2 as a schematic half-cross-section. The structure is essentially rotationally symmetrical about axis A-A. The terms "radial" and "axial" and similar terms will be used herein to denote directions and dimensions which are respectively: "perpendicular to the axis A-A and extending in a plane which contains the axis A-A"; and "parallel to, or co-incident with, the axis A-A". Dimension d is typically about 50 cm, and dimension z is typically about 150 cm.

A number of coils 100 of superconducting wire are provided, each impregnated with a material such as a thermosetting resin, as is conventional in itself. Coils 100 are separated by spacers 102. The spacers may be composed of wire, such as resistive copper wire, wound into coils and impregnated with an impregnating material such as a thermosetting resin; or may be composed of an inert material such as glass fibre cloth or filament, wound and impregnated with a similar impregnating material. The coils are of axial and radial dimensions determined to fulfil their function as sources of magnetic field and to allow robust and not unduly troublesome manufacture, as will be apparent to those skilled in the art. As is also apparent to one skilled in the art, a given objective of magnetic field strength, field homogeneity and dimensions of the homogeneous region may be achieved by a number of different arrangements of coils, having different dimensions, spacing and number. The designer will choose an appropriate arrangement based on other constraints particular to the design in question.

As shown in FIG. 2, in addition to the coils 100 and spacers 102, magnetically inert end-rings 104 are provided on axial extremities of the coil structure 10. These end rings 104 may be of resin-impregnated glass fibre filament. They may have an axial dimension of about 40 mm and a radial dimension equal to that of the adjacent coil 100. They may be formed by impregnation of wound glass fibre or glass bead filler material, or similar. The end rings 104 or an equivalent thereof form part of a support structure according to the present invention.

Figure 3:
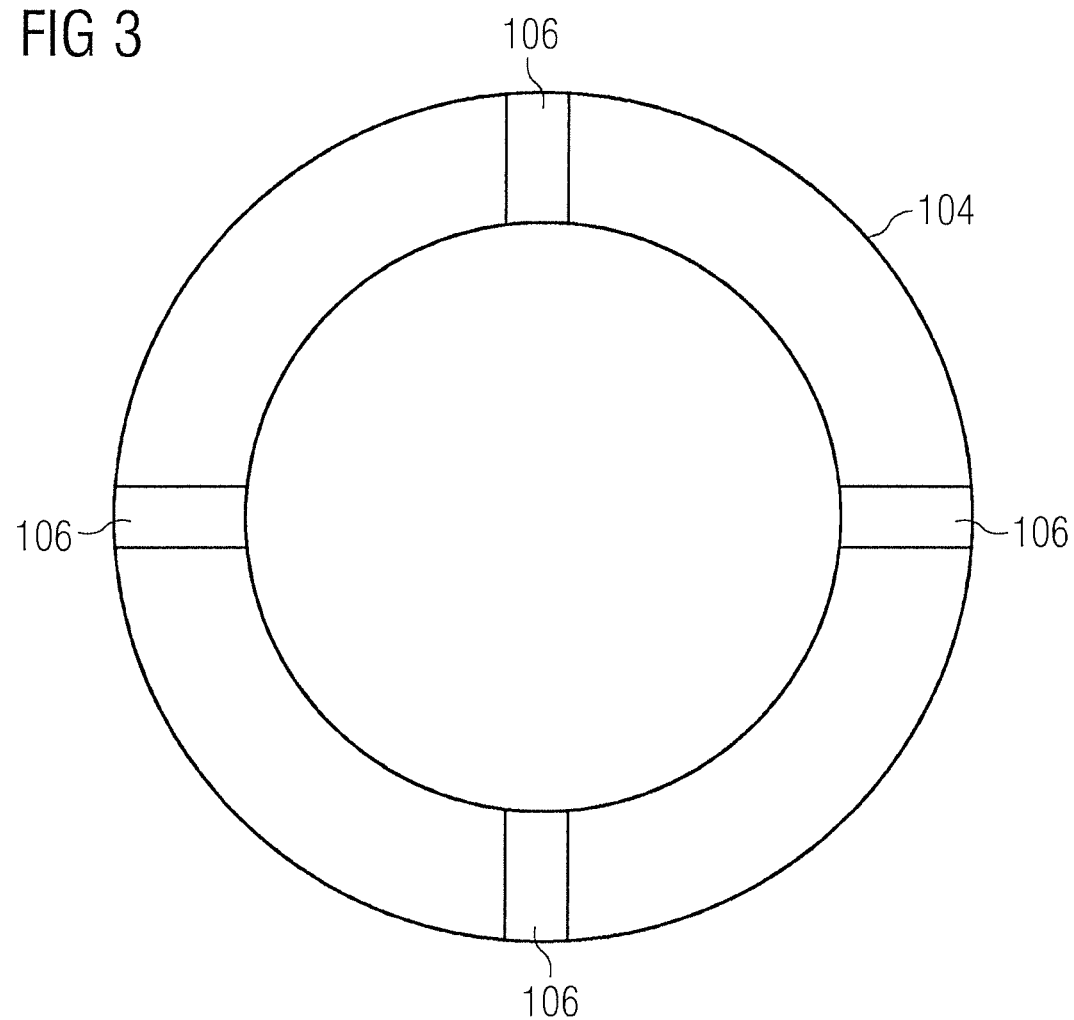
FIG. 3 shows an end ring as applied to a coil structure in an embodiment of the invention.

FIG. 3 shows an axial view of end-ring 104, taken in the direction III shown in FIG. 2. According to a feature of an embodiment of the invention, recesses 106 are provided in the axially-outermost face of the end-ring 104. In the illustrated embodiment, the recesses 106 are slots, radially directed, vertically and horizontally at four positions around the end-ring 104. This is a preferred arrangement, as will be discussed below, but other arrangements are possible within the scope of the present invention. Any number of slots may be used as desired, for example three or six. They are preferably, although not necessarily, arranged at equal intervals around the end-ring 104. The slots may have an axial dimension of for example 20-30 mm.

Figure 4:
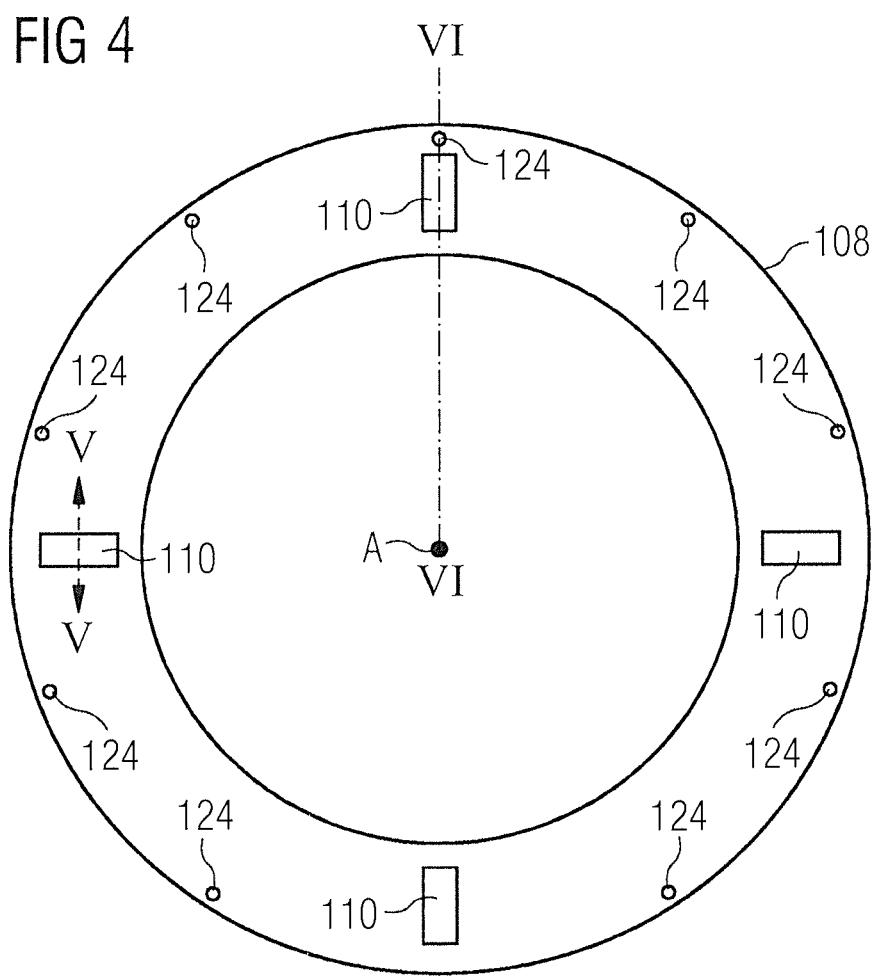
FIG. 4 shows an axial view of certain components of a support structure according to an embodiment of the invention.

FIG. 4 shows an axial view of a support plate 108 of similar dimensions to the end-ring 104. The view shown in FIG. 4 is of a face which will be placed adjacent to the axially outer surface of the end-ring 104, and so corresponds to a view in direction IV shown in FIG. 2.

Support plate 108 may typically be formed of a non-magnetic structural material such as stainless steel or aluminium. Support brackets 110 protrude from the surface of the support plate 108. They are firmly fixed in place, for example by welding. The positions of the support brackets correspond to the positions of the slots 106 machined in the end ring 104.

Figure 5:
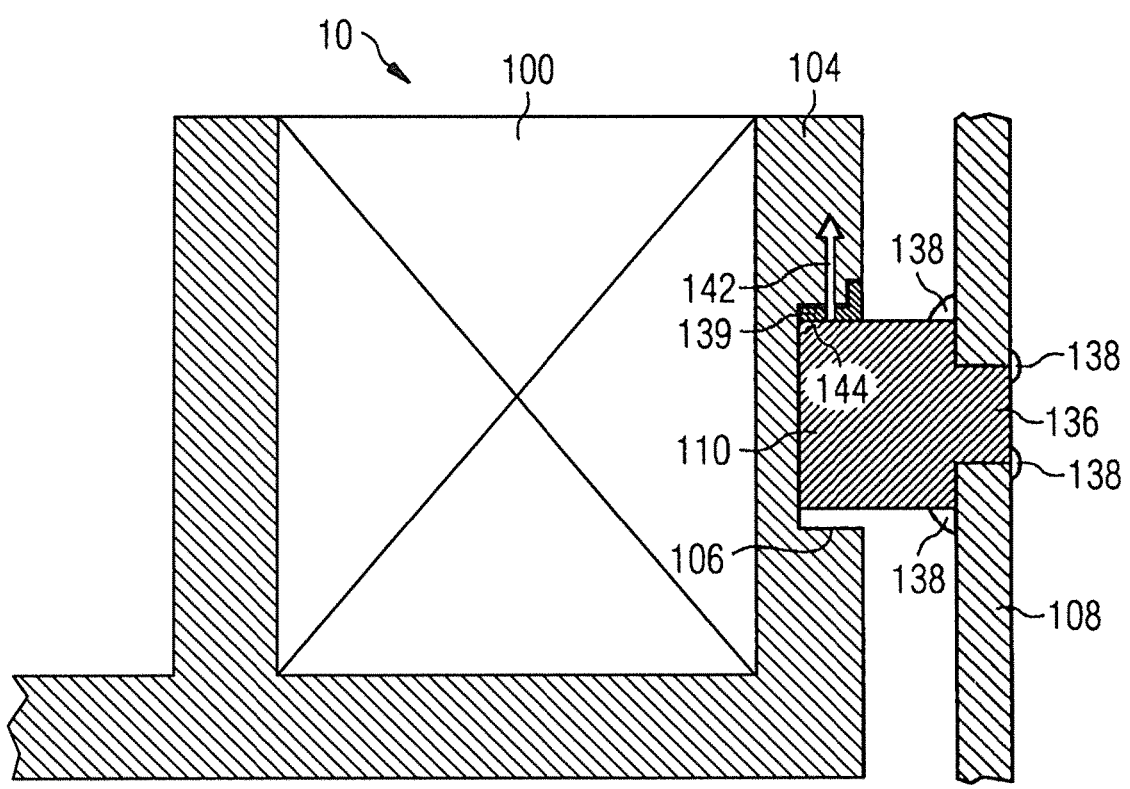
FIG. 5 schematically illustrates a cross-section through a part of a support structure according to an embodiment of the invention.

FIG. 5 shows a schematic cross-section through a support bracket 110 and the surrounding structure, when fully assembled. The view in FIG. 5 corresponds to a partial cross-section through V-V in FIG. 4. FIG. 5 illustrates part of a completed structure according to an embodiment of the present invention.

As shown in FIG. 5, the coil structure 10 is a cylindrical former in which the coil 100 is wound in a cavity that is defined on a radially outer surface of the former, with the recesses 106 defined on the end-ring 104 as an axial end-surface of the former.

An axial end of a coil 100 of coil structure 10 is shown in FIG. 5, with the attached end-ring 104. One of the horizontally-directed slots 106 is shown. Support bracket 110 is firmly attached to support plate 108, for example by insertion of a profiled part 136 into a corresponding cavity in the support plate 108, and welding 138 into place. Support plate 108 and support bracket 110 may be made from stainless steel.

Part of the support bracket 110 protrudes into the recess 106. The part of each support bracket 110 which protrudes onto the recess 106 bears a part of the weight of the coil structure 10. The only exception to this is in the case of vertically-directed recesses such as shown at the upper and lower extremities of the end-ring 104 and the support plate 108. Such recesses and their associated support brackets do not play a part in supporting the weight of the coil structure, but serve to maintain alignment of the coils assembly 10 as will be discussed below.

Considering the present example as shown in FIGS. 3 and 4, the support brackets 110 which protrude into horizontally-directed slots 106, at each axial extremity of the coil structure 10, together bear the weight of the coil structure 10.

Optionally, a metal piece 139, typically a right-angle profile piece, may be provided, bonded to the end-ring 104 to provide a mechanically robust interface surface 144 for contact with the support bracket 110. Preferably, the support bracket 110 and/or the metal piece 139 are coated with a low-friction surface coating, such as tungsten disulphide. This is believed to be particularly useful when the end rings 104 are of a relatively soft material such as resin-impregnated glass fibre. Such metal pieces may be found necessary only to bear vertical loading 142 in slots 106 where part of the weight of the coils assembly is borne.

In some embodiments, support plate 108 may be mounted on a bore tube 120 of a cryogen vessel 12, in which case the support plate 108 supports the weight of the coil structure 10 onto the bore tube of the cryogen vessel 12.

As represented in FIG. 5, but more clearly represented in FIG. 8, the vertical loading 142 which bears the weight of the coil structure 10 is directed circumferentially, in the direction of arrows F, which is the direction of greatest shear strength for a filament-wound structure, such as the coils 100 and preferably also the end-ring 104.

The end-rings 104 are bonded to the adjacent coil 100 over a large surface area, and the support surface 144 provided by the recesses 106 is axially close to the coils, while maintaining thermal isolation therefrom. These features act together to provide a relatively low shear force between the coil 100 and the end-ring 104.

The radial slot 106 in the end rings of the described example allows the coil structure to contract in the radial and axial directions whilst maintaining the vertical support 142 of the coil structure 10 by the support brackets 110. The ranges of axial (dx) and radial (dr) movement enabled by this arrangement of slots 106 and support brackets 110 are respectively represented in FIGS. 7-8. When the coil structure 10 is cooled, it will contract both radially and axially. The support brackets 110 supporting the weight of the coil structure will ensure that the coil structure retains the vertical position of its axis.

Other support brackets 110 protrude into the vertically-oriented slots 106 represented in FIGS. 3, 8, in structures essentially the same as that shown in FIG. 5, except that those support brackets 110 do not bear any of the weight of the coil structure. They serve to ensure and maintain horizontal axial alignment of the coil structure 10. The metal pieces 139, illustrated in FIG. 5, may not be required for such vertically-oriented slots.

The end-rings 104 may be formed separately from the coils, with the recesses 106 such as slots, formed in them for example by machining, and the end-rings then attached to the axially end-most coils 100. Alternatively, the end-rings may be formed with the coil structure 10, for example by winding glass fibre cloth, then impregnating with a thermo-setting resin to both define the end-rings 104 and bond them to the coil structure 10. Alternatively, the end-rings may be formed by wet-winding glass fibre filament into a volume adjacent the axially end-most coils. The recesses 106 may then be cut into the end-ring so formed, for example by machining.

Recesses 106 need not be slots extending through the entire radial extent of the end-ring, although it may be found simpler to machine such slots than recesses which only extend part of the radial extent. The recesses may be formed with circular, or oval, radial cross-sections, for example, and the support brackets may likewise be formed with circular or oval radial cross-sections, for example.

By supporting the coil structure 10 on support brackets 110 as described here, mechanical deformation due to the weight of the coil structure itself is limited. In a simulation, an approximately 1.5 tonne magnet structure was found to deform only by about 0.4 mm due to its own weight when supported according to the present invention.

Considering FIG. 8 again briefly, the weight of coil structure 10 is borne by forces shown at F. The weight of the upper part of coil structure 10 would tend to urge the coil structure to expand horizontally at the support surfaces 144, while the weight of the lower part of the coil structure would tend to urge the coil structure to contract horizontally at the support surfaces 144. These opposing effects tend to cancel out and enable the coil structure 10 to remain more round in radial cross section than has been the case for conventionally supported coil assemblies.

In use, the coil structure 10 will be subjected to significant hoop stress: the interaction of the coils 100 of superconducting wire with the magnetic field they are producing will generate a force tending to cause the coils to expand radially. By mounting the coil structure 10 on support brackets 110, as described, the coil structure is allowed to expand and contract by relative motion between the support brackets 110 and end-ring 104. Preferably, at least the load-bearing support brackets 110 are covered with a low-friction coating, such as tungsten disulphide. This ensures that relative movement between the end-ring 104 and the support brackets 110 may take place without generating significant heating, or stick-slip motion, either of which might cause quenching of the superconducting coils 100. By ensuring that the support brackets 110, and particularly the load-bearing surfaces 144 of the end ring 104 are separated from the coils 100 by a certain thickness of the end-ring, an appropriate degree of thermal isolation may be provided, and any heat generated at the interface between support bracket 110 and end-ring 104 will diffuse and will not reach the coils at a particular point, reducing the likelihood that such heat would cause a quench.

Barrelling of the coil structure 10 in use, as typically caused by hoop stress, causes the axial end surfaces of the coils 100 to tilt with respect to the radial direction. The support structure of the present invention addresses this issue, as any tilting of the axial end faces is decoupled from the support and alignment interfaces provided by the support brackets 110 and bearing surfaces 144. Similarly, the axial compression of the coil structure on cooling is decoupled from vertical support of the coil structure provided by the recesses 106 supporting the weight of the coil structure 100.

Figure 6:
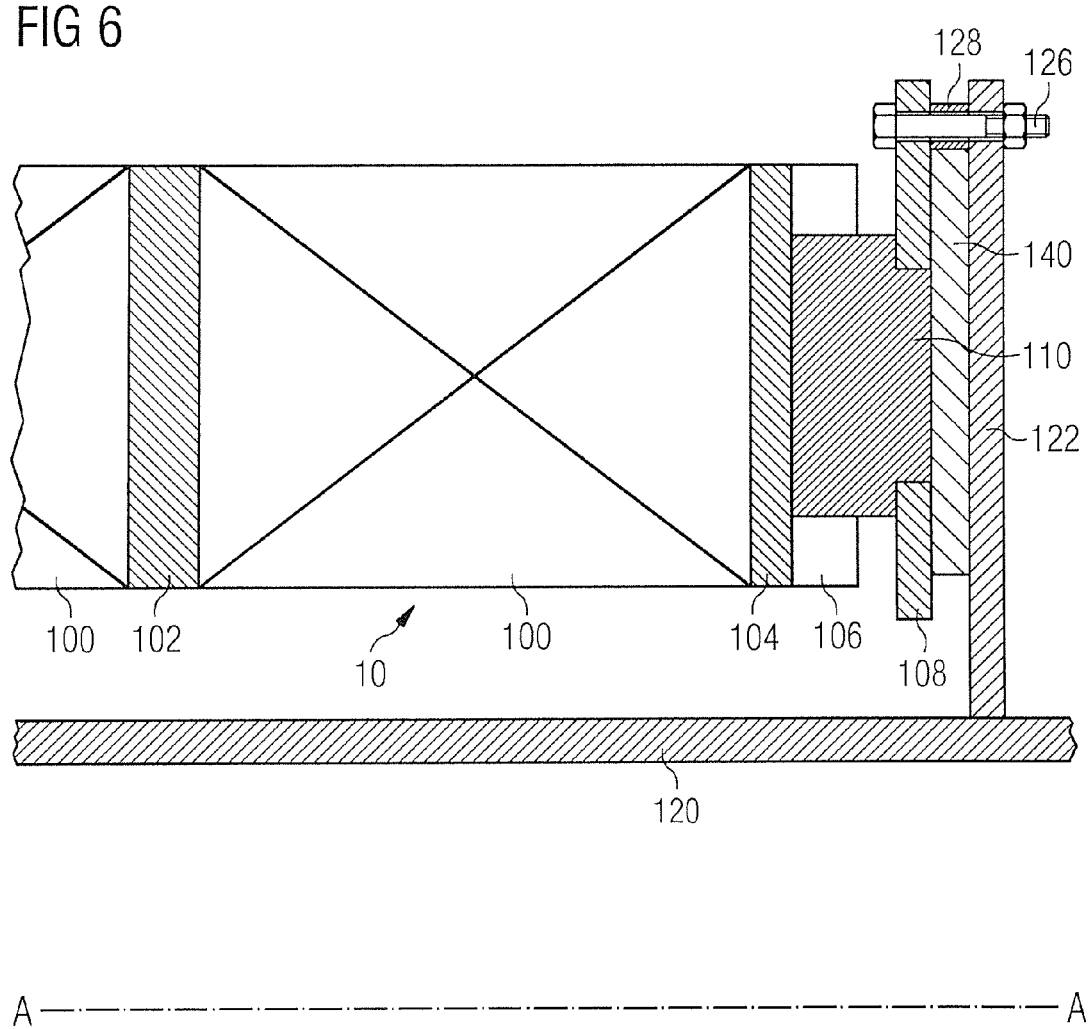
FIG. 6 schematically illustrates a cross-section through a support structure according to an embodiment of the present invention along line VII-VII in FIG. 4.

FIG. 6 shows a schematic cross-sectional view of a coil structure 10 supported by a support structure according to an embodiment of the present invention, taken along line VI-VI of FIG. 4, showing coil structure 10, end rings 104, support plate 108, backing plate 122, support brackets 110, support members 140, spacers 128, fasteners 126.

In this arrangement, backing plate 122 is mounted on bore tube 120 of the cryogen vessel. Backing plate 122 may be welded on to the bore tube 120, or may be loose. Support plate 108 is mechanically supported on the backing plate 122, for example by nuts and bolts 126, or some equivalent fasteners or welding, brazing etc. Support members 140 and/or spacers 128 may be provided to ensure an appropriate spacing between the support plate 108 and backing plate 122. In alternative embodiments, the support plate 122 may be a complete annular disc, or may be replaced by a number of brackets distributed around the circumference of the bore tube 120, attached to the bore tube for example by welding. By welding the support plate 122 onto cryogen vessel bore tube 120, better support may be provided than the point-loading which might result if the backing plate 122 is loose on the bore tube 120.

In other embodiments, the support plate 108 may itself be mounted on the bore tube 120, loose or welded, or otherwise fastened. In yet further embodiments, backing plate 122 or support plate 108 may form an annular end piece of a cryogen vessel.

In all arrangements of the present invention, the coil structure 100 is able to expand and contract in axial and radial directions without being constrained by the support structure. The support structure will itself contract when cooled, but will effectively support the coil structure when contracting to a different extent than the support structure. Expected relative contractions of the coil structure when cooling from 300K to 4K are axially: 6 mm, radially 2 mm.

During a quench event, a commensurate degree of expansion can be accommodated by the support structure of the present invention.

The support structure is preferably made of the same material as the bore tube 120 of the cryogen vessel 12, to minimise any differential thermal contraction between the support structure and the bore tube upon which it rests.

In some embodiments of the present invention, a support structure comprising recesses and support brackets as described above may be provided at one end of the coil structure only, with the position of the other end being retained by more conventional means. Alternatively, the support structure of the present invention may be provided at both axial ends of the coil structure 10.

The present invention maintains concentricity of the coil structure 100 with the support structure, throughout the expected range of temperatures and operational conditions which the coils may be expected to experience. The temperature of the coils will vary between several temperatures over its lifetime, for example, room temperature (about 300K), operating temperature (which may be as low as 4K), and higher temperatures during quench, such as 150K. The support structure of the present invention also provides support and alignment while accommodating differential axial thermal contraction, and radial expansion.

While the present invention has been described by reference to a number of particular embodiments, it will be apparent to those skilled in the art that numerous modifications and variations may be performed within the scope of the present invention.

For example, although the preferred embodiment, described, has four slots 106 and four support brackets 110, distributed equally around the circumference of the end-ring, and defining horizontal surfaces 144 for bearing the weight of the coil structure and vertical surfaces for ensuring the alignment of the coils, other combinations of positions for the recesses 106 and retaining brackets 110 may be employed. For example, the lower-most slot 106 and support bracket 110 shown in FIGS. 3-4 may be omitted, leaving the remaining vertically-directed slot 106 and associated support bracket 110 to provide the required horizontal alignment of the coil structure 10. Alternatively, for example, three or six recesses 106 with associated support brackets 110 may be provided, equally or unequally distributed around the circumference of the end ring, and sharing the tasks of supporting the weight of the coil structure and maintaining the alignment of the coils according to their orientation with respect to the axis A-A.

Figure 9:
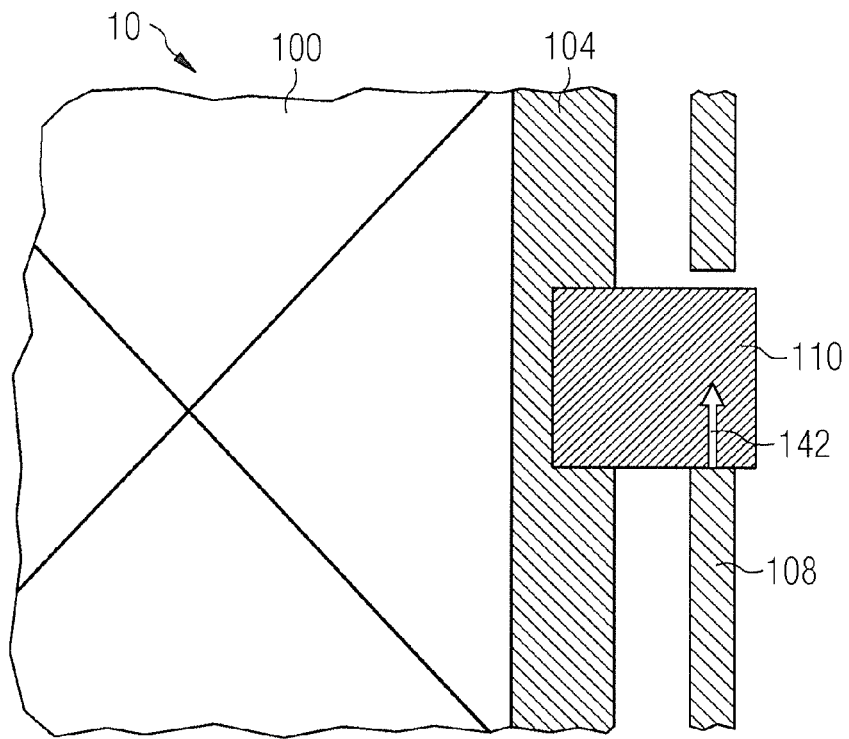
FIGS. 9 and 10 schematically illustrate alternative embodiments of the present invention.

An alternative arrangement, schematically illustrated in FIG. 9, provides support brackets 110 bonded to end rings 104, supporting 142 the weight of the coil assembly 10 by interaction with cavities in the support ring 108. However, it is presently believed to be simplest to machine slots 106 into GRP end rings 104 and to weld brackets 110 onto stainless steel support rings 108 as described with reference to FIGS. 3-8, partly due to simplicity of welding as compared to bonding brackets of appropriate strength to the end rings 104.

Figure 10:
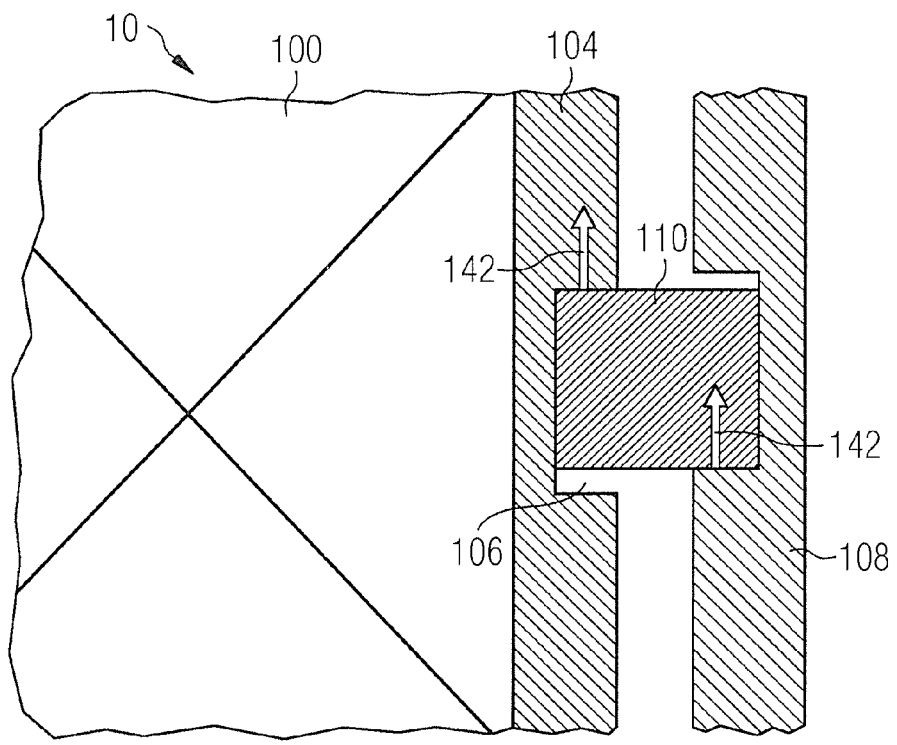

In a further alternative, schematically illustrated in FIG. 10, the support brackets 110 may not be attached to either the end ring 104 or the support ring 108, but may be blocks which protrude into recesses formed in both of these components. In such arrangements, it is preferred that at least one recess per support bracket is not a complete slot, but is closed both ends to ensure that the support brackets cannot come loose. A similar effect can be obtained by having, for each support bracket 110, a recess in one component which is closed at a radially outer end but open at a radially inner end; and a recess in the other component which is closed at a radially inner end, but open at a radially outer end.

Figure 11:
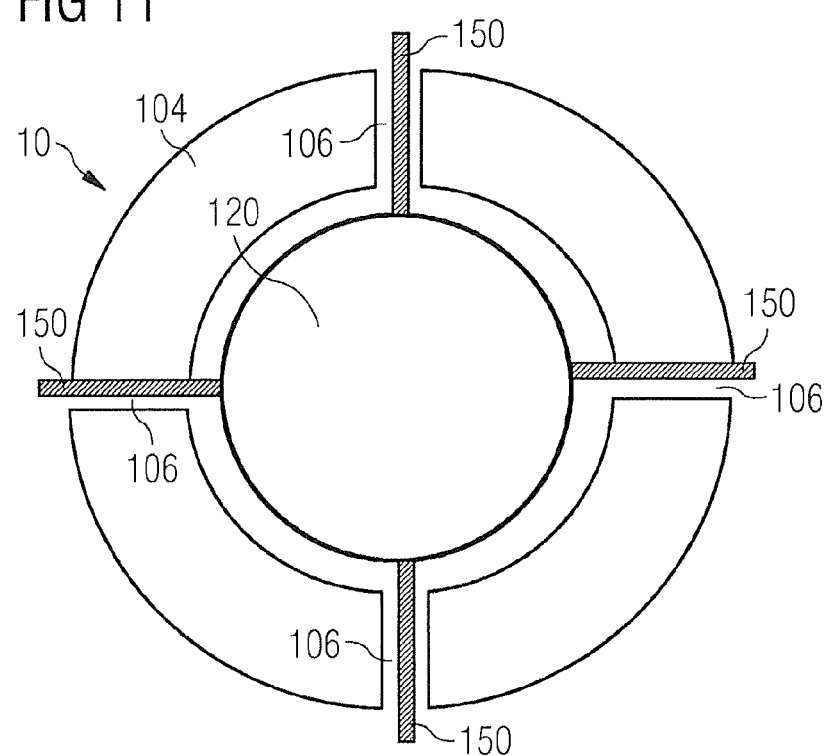
FIG. 11 illustrates features of an embodiment of the invention in which the coil structure is supported by the bore tube of the cryogen vessel.

In further alternative embodiments, the support rings 108 and backing rings 122 may be dispensed with and the coil structure supported by support brackets mounted directly on the cryogen vessel bore tube 120. FIG. 11 shows an axial view of such an arrangement. Support brackets 150, which may be of rectangular cross section, are bonded to the bore tube 120 of the cryogen vessel, for example by welding. The coil structure 10 includes end rings 104, which carry slots 106 as discussed above. By appropriate dimensioning and assembly, parts of support brackets 150 protrude into respective slots 106, and support the weight of the coil structure, and ensure axial alignment, in the same manner as the support brackets discussed above.

Figure 12:
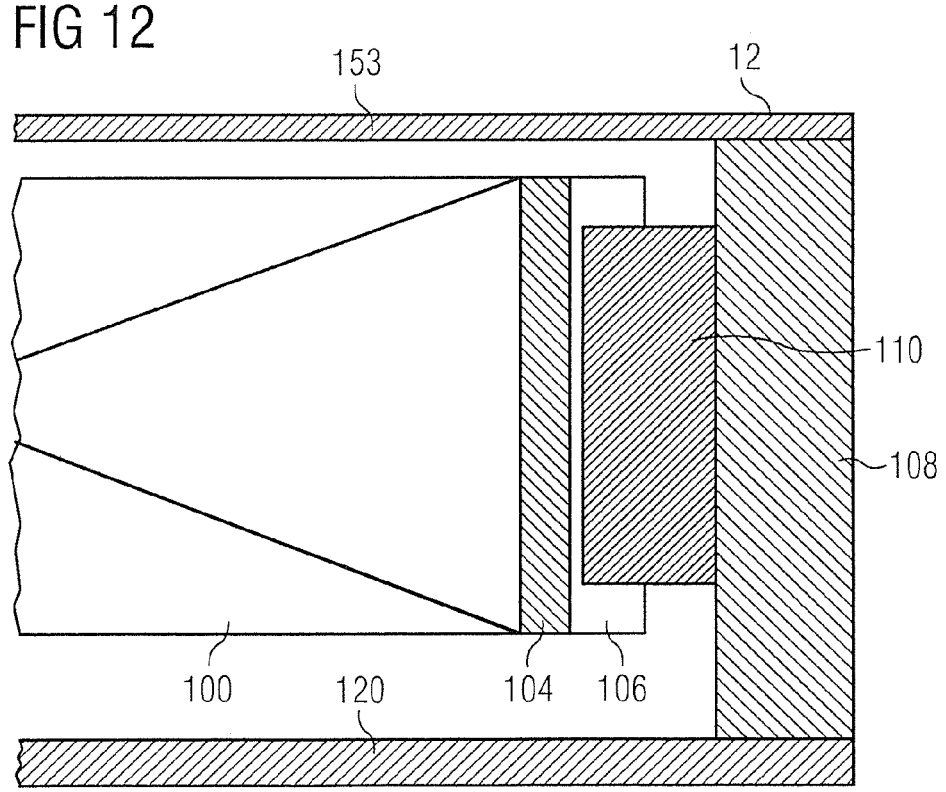
FIG. 12 illustrates features on of an embodiment of the invention in which the coil structure is supported by end plates of the cryogen vessel.

In another alternative, illustrated in FIG. 12, support rings 108 may be used as end plates of the cryogen vessel 12. In such an embodiment, the cryogen vessel essentially consists of bore tube 120, an outer cylindrical wall 153 and support rings 108 welded between the bore tube and the outer cylindrical wall to define a hollow cylindrical enclosure. Of course, in such embodiments, no through-holes may be provided in the support rings 108.

The support structure of the present invention enables simultaneous relative axial and radial movements between the coil structure and the support structure, and maintains coil concentricity, and reduces the tendency for the coil structure to deform out of round in its radial cross section due to its weight being supported at diametrically opposite points.

While the present invention has been described with reference to a limited number of example embodiments, further embodiments and variations will be apparent to those skilled in the art, within the scope of the present invention as defined in the appended claims.

For example, the present invention may be applied to coils mounted on formers, in that recesses 106 may be formed in axial end-surfaces of the former, and the former may be retained by support brackets as discussed above.

Although modifications and changes may be suggested by those skilled in the art, it is the intention of the inventors to embody within the patent warranted heron all changes and modifications as reasonably and properly come within the scope of their contribution to the art.

We claim as our invention:

1. An assembly comprising:
   a cylindrical superconducting coil structure comprising a superconducting coil and an end-ring at an axial end of the superconducting coil, providing an axially outer end-surface of the cylindrical superconducting coil structure;
   a support structure that supports said cylindrical superconducting coil structure;
   the axially outer end-surface of the superconducting coil structure having recesses therein;
   the support structure comprising support brackets protruding horizontally into the recesses making a vertical loading on the support brackets bear the weight of the coil structure; and
   the support structure further comprising a support member that supports the support brackets, thereby also bearing the weight of the coil structure.

2. An assembly according to claim 1 wherein the coil structure comprises a cylindrical former with coils wound into cavities defined on a radially outer surface of the cylindrical former, and the recesses are defined on an axial end-surface of the former.

3. An assembly according to claim 1 wherein the coil structure comprises a plurality of annular coils respectively separated by spacers.

4. An assembly according to claim 1, wherein the end-ring is concentric with the cylindrical superconducting coil structure, and the recesses are in the end-ring.

5. An assembly according to claim 4 wherein the end-ring has a radial dimension equal to that of an adjacent coil.

6. An assembly according to claim 4 wherein the recesses comprise radial slots formed in the end-ring.

7. An assembly according to claim 6 wherein the radial slots are directed vertically and horizontally at four positions around the axial end-surface of the coil structure.

8. An assembly according to claim 1, wherein at least one of said recess has a metal piece forming a mechanically robust interface surface for contact with the support bracket.

9. An assembly according to claim 8, wherein at least one of the support bracket the metal piece is coated with a low-friction surface coating.

10. An assembly according to claim 1, further comprising a support plate of non-magnetic material carrying the support brackets that protrude from an axial end-surface of the support plate, such that positions of the support brackets correspond to positions of the recesses.

11. An assembly according to claim 10 wherein the support plate is mounted on a bore tube of a cryogen vessel containing the coil structure.

12. An assembly according to claim 10 comprising a backing plate on which the support plate is mechanically supported.

13. An assembly according to claim 12 wherein the backing plate is mounted on a bore tube of a cryogen vessel containing the coil structure.

14. An assembly according to claim 11 comprising a number of further brackets distributed around the circumference of the bore tube of the cryogen vessel containing the coil structure, and the support plate is mechanically supported on the further brackets.

15. An assembly according to claim 10 wherein the support plate forms an annular end piece of a cryogen vessel containing the coil structure.

16. An assembly according to claim 13 wherein the backing plate forms an annular end piece of a cryogen vessel containing the coil structure.

17. An assembly according to claim 1, wherein the support brackets are bonded to the end ring, and wherein said support plate is a support plate of non-magnetic material having cavities therein at positions corresponding to positions of the support brackets, and wherein said support brackets support the weight of the coil structure by interaction with said cavities.

18. An assembly according to claim 1, wherein the support member is a support plate of non-magnetic material having recesses therein, and the support brackets comprise blocks that protrude into the recesses in both the end-ring and said support plate.

19. An assembly according to claim 18, wherein at least one recess per support bracket is not a complete slot, but is closed at both ends.

20. An assembly according to claim 18, wherein, for each support bracket, a recess in one of the end-ring and the support plate is closed at a radially outer end but open at a radially inner end; and a recess in the other of the end-ring and the support plate is closed at a radially inner end but open at a radially outer end.

21. An assembly according to claim 1, wherein the support brackets are mounted directly on a bore tube of a cryogen vessel containing the coil structure.

22. An assembly according to claim 1, wherein the recesses have circular, or oval, radial cross-sections.

23. An assembly according to claim 1, wherein the support brackets have circular or oval radial cross-sections.

24. An assembly according to claim 1, wherein the support structure comprises support brackets protruding into the recesses, at one axial end of the coil structure only.

25. An assembly according to claim 1, wherein the support structure comprises support brackets (110) protruding into the recesses, at both axial ends of the coil structure.

* * * * *